(12) United States Patent
Andry et al.

(10) Patent No.: US 9,822,002 B1
(45) Date of Patent: Nov. 21, 2017

(54) FLEXIBLE ELECTRONICS FOR WEARABLE HEALTHCARE SENSORS

(71) Applicant: International Business Machines Corporation, Armonk, NY (US)

(72) Inventors: Paul S. Andry, Yorktown Heights, NY (US); Huan Hu, Yorktown Heights, NY (US); Katsuyuki Sakuma, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/262,897

(22) Filed: Sep. 12, 2016

(51) Int. Cl.
| | | |
|---|---|---|
| *H01L 21/84* | (2006.01) | |
| *B81C 1/00* | (2006.01) | |
| *B81B 3/00* | (2006.01) | |

(52) U.S. Cl.
CPC ......... *B81C 1/0038* (2013.01); *B81B 3/0097* (2013.01); *B81B 2201/0292* (2013.01); *B81B 2207/07* (2013.01); *B81C 2201/0195* (2013.01)

(58) Field of Classification Search
CPC ..... H01L 21/6835; H01L 21/84; H01L 25/50; H01L 27/0688
See application file for complete search history.

(56) References Cited

U.S. PATENT DOCUMENTS

| | | | |
|---|---|---|---|
| 6,360,615 B1 | 3/2002 | Smela | |
| 6,763,156 B2 | 7/2004 | Palmer et al. | |
| 7,893,810 B2 | 2/2011 | Ohta et al. | |
| 8,440,546 B2 | 5/2013 | Nuzzo et al. | |
| 8,826,747 B2 | 9/2014 | Lee et al. | |
| 8,927,338 B1 | 1/2015 | Bedell et al. | |
| 9,029,238 B2 | 5/2015 | Andry et al. | |
| 2006/0057836 A1 | 3/2006 | Nagarajan et al. | |
| 2011/0045577 A1* | 2/2011 | Bruzewicz | H05K 3/101 435/287.1 |
| 2013/0149817 A1* | 6/2013 | Jeon | H01L 21/67144 438/118 |
| 2013/0243655 A1* | 9/2013 | Li | G01N 33/50 422/82.05 |
| 2013/0306971 A1* | 11/2013 | Bedell | H01L 21/84 257/59 |
| 2015/0129276 A1 | 5/2015 | Shumaker et al. | |

(Continued)

OTHER PUBLICATIONS

C.W. Park et al., "Photolithography-Based Patterning of Liquid Metal Interconnects for Monolithically Integrated Stretchable Circuits," ACS Applied Materials & Interfaces, Web publication, Jun. 2, 2016, 7 pages.

(Continued)

*Primary Examiner* — Whitney T Moore
*Assistant Examiner* — Joseph Galvin, III
(74) *Attorney, Agent, or Firm* — Cantor Colburn LLP; Vazken Alexanian

(57) ABSTRACT

Aspects include a method of manufacturing a flexible electronic structure that includes a metal or doped silicon substrate. Aspects include depositing an adhesive layer on the top side of the structure. Aspects also include depositing a release layer and a glass layer on the top side of the structure. Aspects also include reducing a thickness of the silicon substrate on the bottom side of the structure.

20 Claims, 26 Drawing Sheets

(56) References Cited

U.S. PATENT DOCUMENTS

| | | | |
|---|---|---|---|
| 2015/0230720 A1* | 8/2015 | Hekmatshoartabari | ............................ A61B 5/04001 600/377 |
| 2015/0380523 A1* | 12/2015 | Hekmatshoartabari | ............................ H01L 27/1222 438/166 |
| 2016/0005700 A1 | 1/2016 | Rogers et al. | |

OTHER PUBLICATIONS

Hu et al., "Super Flexible Sensor Skin Using Liquid Metal as Interconnect" IEEE Sensors Conference Paper, 2007, pp. 815-817.

K. Hiller et al., "Bonding and Deep RIE, A Powerful Combination for High-Aspect-Ratio-Sensors and Actuators," Proc. of SPIE, vol. 5715, 2005, pp. 80-91.

Kim et al., "A Biaxial Stretchable Interconnect With Liquid-Alloy-Covered Joints on Elastomeric Substrate," IEEE/ASME J. Microelectromech. Systems, vol. 18, pp. 138-146, Jan. 2009.

Zhuang et al., "Flexible Transducer Arrays with Through-Wafer Electrical Interconnects Based on Trench Refilling with PDMS," 20th International Conference on Micro Electro Mechanical Systems, 2007, pp. 73-76.

List of IBM Patents or Patent Applications Treated as Related; (Appendix P), Date Filed—Feb. 14, 2017; 2 pages.

Non-Provisional U.S. Appl. No. 15/262,912, filed Sep. 12, 2016; Entitled: Flexible Electronics for Wearable Healthcare Sensors.

* cited by examiner

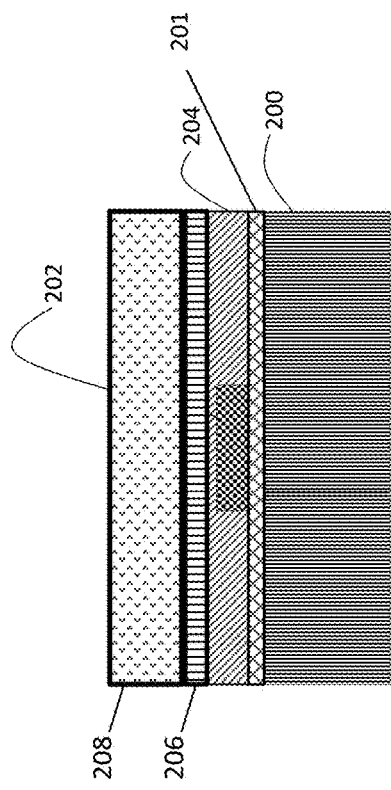
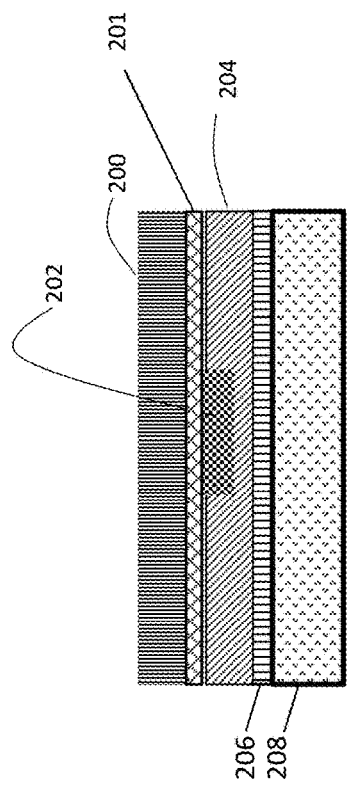
FIG. 2C
FIG. 2D

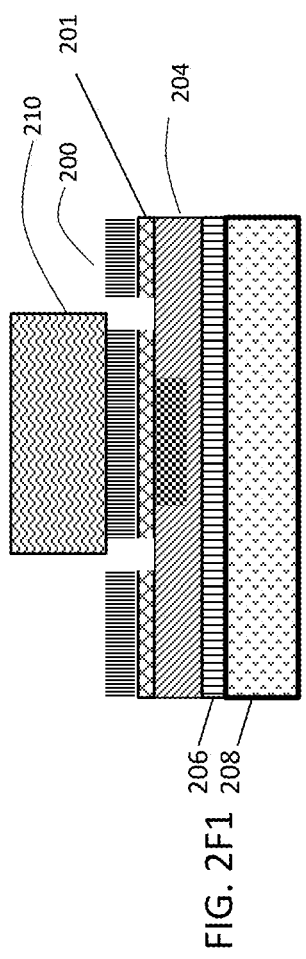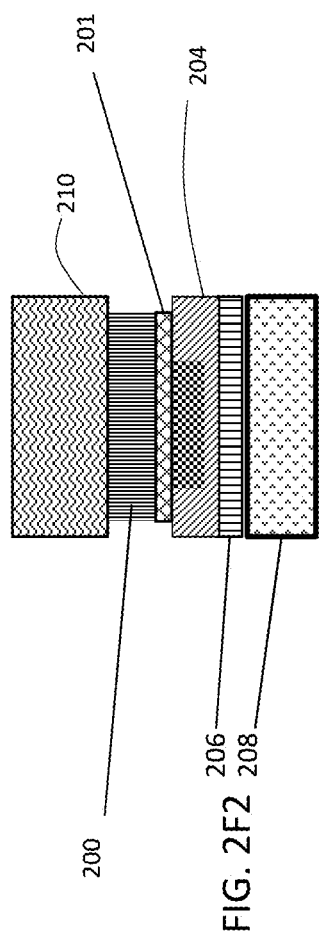
FIG. 2F1
FIG. 2F2

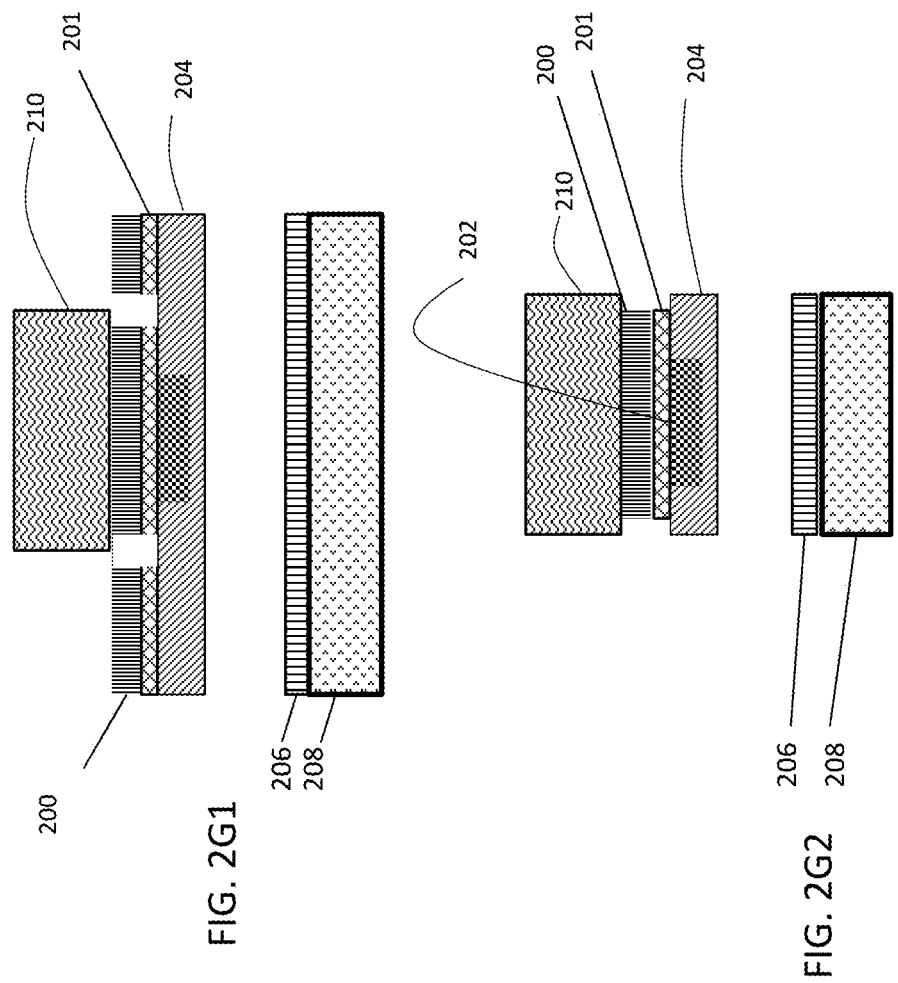

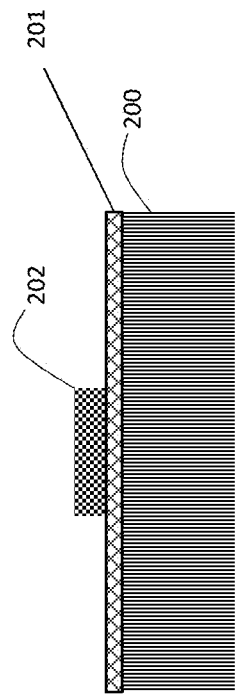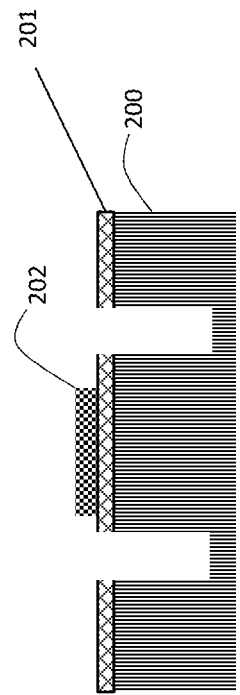
FIG. 3A
FIG. 3B

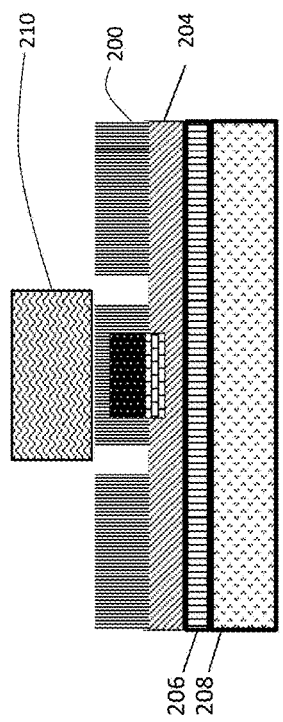
FIG. 4F1
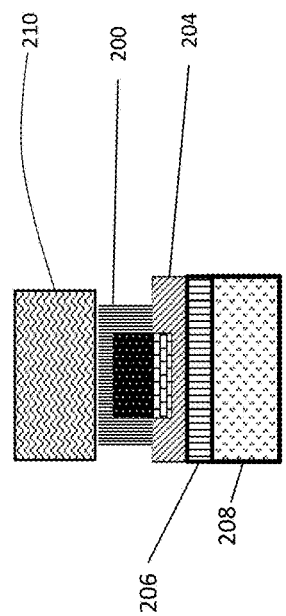
FIG. 4F2

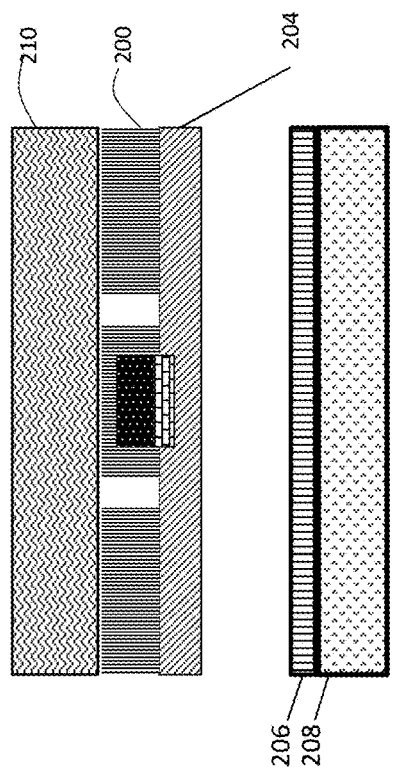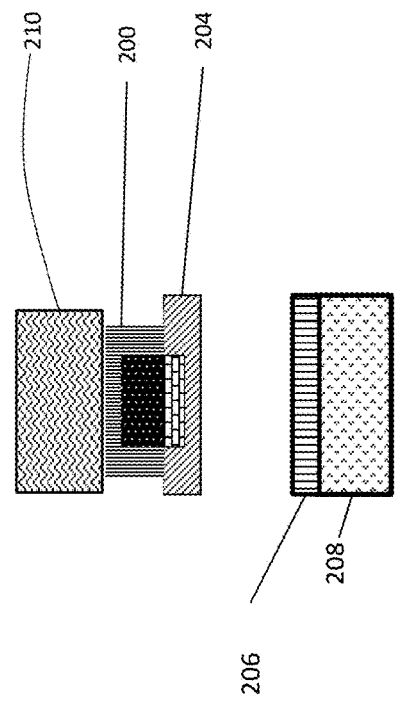
FIG. 4G1
FIG. 4G2

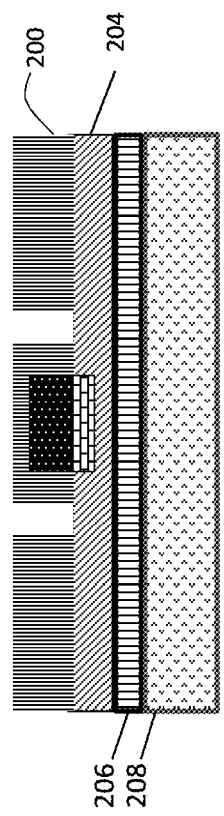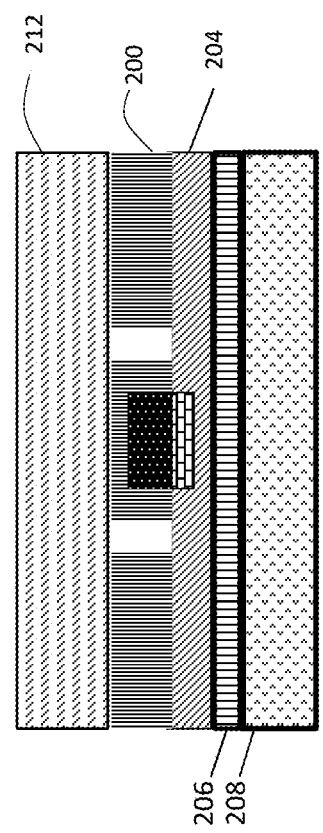

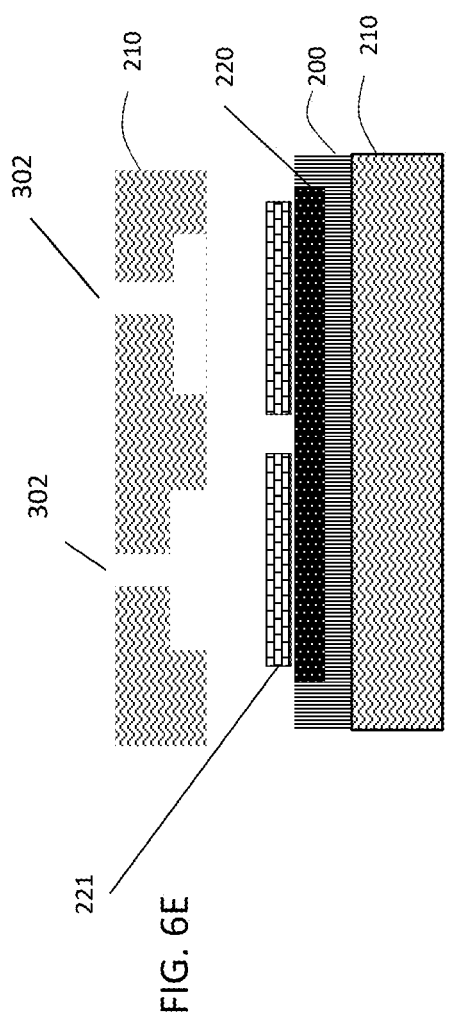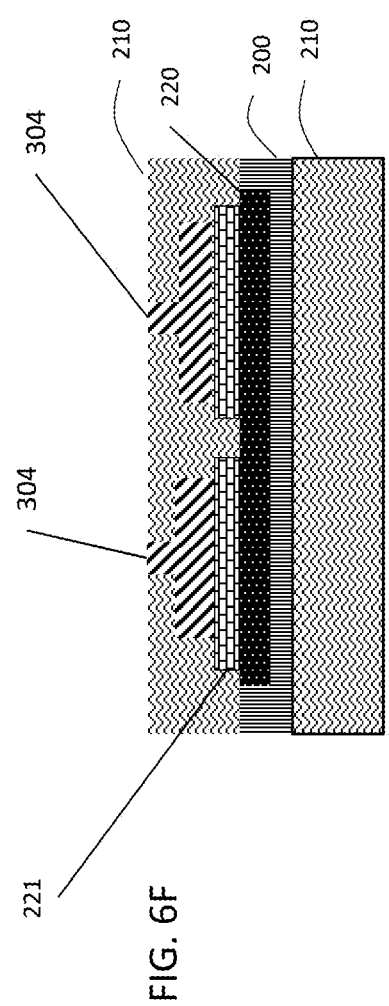

FLEXIBLE ELECTRONICS FOR WEARABLE HEALTHCARE SENSORS

BACKGROUND

The present invention relates to wearable healthcare sensors, and more specifically, to manufacture of flexible electronics for wearable health care sensors.

Health care sensors can present challenges in manufacture. For example, healthcare sensors or biosensors, in many applications, are to be applied to nonplanar or curvilinear surfaces, such as the surface of a finger or arm. One approach for manufacturing sensors capable of conforming to such surfaces involves the investigation of new materials, such as nanowires, carbon nanotubes, or nanocomposites. However, the complexity, reliability, and performance of such materials can be relatively poor compared to the performance of conventional solid-state electronics on a bulk substrate. The use of conventional semiconductor materials, such as silicon, offers potentially better performance and reliability in healthcare applications. However the use of conventional materials can pose challenges in manufacture when attempting to achieve a thickness that can sufficiently withstand the mechanical deformation needed to conform the semiconductor materials to nonplanar surfaces.

SUMMARY

In accordance with one or more embodiments, a method of manufacturing a flexible electronic structure includes patterning a metal conductive material on a silicon substrate on the top side of the structure. The method also includes depositing an adhesive layer on the top side of the structure. The method also includes depositing a release layer and a glass layer on the top side of the structure. The method also includes reducing a thickness of the silicon substrate on the bottom side of the structure.

In accordance with another embodiment, a method for manufacturing a flexible electronic structure includes patterning a metal conductive material on a silicon substrate on the top side of the structure. The method also includes etching the silicon substrate on the top side of the structure with deep reactive ion etch. The method also includes depositing an adhesive layer on the top side of the structure. The method also includes depositing a release layer and a glass layer on the top side of the structure. The method also includes reducing a thickness of the silicon substrate on the bottom side of the structure.

BRIEF DESCRIPTION OF THE DRAWINGS

The foregoing and other features and advantages of the one or more embodiments described herein are apparent from the following detailed description taken in conjunction with the accompanying drawings in which:

FIGS. 1A-1C illustrate one known process for forming a thinned down semiconductor using a spalling technique, in which:

FIG. 1A is a cross-sectional view of a semiconductor structure after deposition of a layer with tensile stress on a substrate;

FIG. 1B is a cross-sectional view of a semiconductor structure after deposition of a flexible handle on the layer with tensile stress; and FIG. 1C is a cross-sectional view of a semiconductor structure after lifting the layer with tensile stress to create a thin silicon ribbon.

FIGS. 2A-2H illustrate an exemplary fabrication process of forming flexible electronics using metal strain gauge according to one or more embodiments, in which:

FIG. 2A is a cross-sectional view of a semiconductor structure after patterning metal conductive material on an insulation layer on a silicon substrate;

FIG. 2B is a cross-sectional view of a semiconductor structure after depositing an adhesive layer on the structure;

FIG. 2C is a cross-sectional view of a semiconductor structure after bonding glass on the structure;

FIG. 2D is a cross-sectional view of a semiconductor structure after thinning the silicon substrate;

FIG. 2E is a cross-sectional view of a semiconductor structure after etching the silicon substrate;

FIG. 2F1 is a cross-sectional view of a semiconductor structure after bonding polymer (e.g. polydimethylsiloxane (PDMS)) to the silicon;

FIG. 2F2 is a cross-sectional view of the semiconductor structure of FIG. 2E after bonding polymer to the silicon after optional dicing;

FIG. 2G1 is a cross-sectional view of the semiconductor structure of FIG. 2F1 after releasing the glass;

FIG. 2G2 is a cross-sectional view of the semiconductor structure of FIG. 2F2 after releasing the glass; and FIG. 2H is a cross-sectional view of a semiconductor structure illustrating the silicon ribbon layer after removal of the adhesive layer.

FIGS. 3A-3J illustrate another exemplary fabrication process of forming flexible electronics using metal strain gauge according to one or more embodiments, in which:

FIG. 3A is a cross-sectional view of a semiconductor structure after depositing metal conductive material on an insulation layer on a silicon substrate;

FIG. 3B is a cross-sectional view of a semiconductor structure after etching the silicon;

FIG. 3C is a cross-sectional view of a semiconductor structure after depositing an adhesive layer to the metal and silicon;

FIG. 3D is a cross-sectional view of a semiconductor structure after depositing a release layer and glass layer on the adhesive layer;

FIG. 3E is a cross-sectional view of a semiconductor structure after thinning the silicon;

FIG. 3F is a cross-sectional view of a semiconductor structure after applying ultra-violet (UV) release tape to the silicon;

FIG. 3G is a cross-sectional view of a semiconductor structure after releasing the glass from the adhesive layer;

FIG. 3H is a cross-sectional view of a semiconductor structure after applying transfer tape to the structure;

FIG. 3I is a cross-sectional view of a semiconductor structure after removing the release tape and applying a polymer (e.g. PDMS) layer; and FIG. 3J is a cross-sectional view of a semiconductor structure illustrating the structure after removal of the transfer tape.

FIGS. 4A-4H an exemplary fabrication process of forming flexible electronics using doped silicon strain gauge according to one or more embodiments, in which:

FIG. 4A is a cross-sectional view of a semiconductor structure after depositing a metal ohmic contact material after doping a silicon substrate;

FIG. 4B is a cross-sectional view of a semiconductor structure after depositing an adhesive layer on the structure;

FIG. 4C is a cross-sectional view of a semiconductor structure after bonding glass on the structure;

FIG. 4D is a cross-sectional view of a semiconductor structure after thinning the silicon substrate;

FIG. 4E is a cross-sectional view of a semiconductor structure after etching the silicon substrate;

FIG. 4F1 is a cross-sectional view of a semiconductor structure after bonding polymer (e.g. PDMS) to the silicon;

FIG. 4F2 is a cross-sectional view of the semiconductor structure of FIG. 4E after bonding polymer to the silicon after optional dicing;

FIG. 4G1 is a cross-sectional view of the semiconductor structure of FIG. 4F1 of FIG. 4F1 after releasing the glass;

FIG. 4G2 is a cross-sectional view of the semiconductor structure of FIG. 4F2 after releasing the glass; and FIG. 4H is a cross-sectional view of a semiconductor structure illustrating the silicon ribbon layer after removal of the adhesive layer.

FIGS. 5A-5J illustrate another exemplary fabrication process of forming flexible electronics using doped silicon strain gauge according to one or more embodiments, in which:

FIG. 5A is a cross-sectional view of a semiconductor structure after doping a silicon substrate;

FIG. 5B is a cross-sectional view of a semiconductor structure after etching the silicon;

FIG. 5C is a cross-sectional view of a semiconductor structure after depositing an adhesive layer to the doped silicon region and silicon;

FIG. 5D is a cross-sectional view of a semiconductor structure after depositing a release layer and glass layer on the adhesive layer;

FIG. 5E is a cross-sectional view of a semiconductor structure after thinning the silicon;

FIG. 5F is a cross-sectional view of a semiconductor structure after applying UV release tape to the silicon;

FIG. 5G is a cross-sectional view of a semiconductor structure after releasing the glass from the adhesive layer;

FIG. 5H is a cross-sectional view of a semiconductor structure after applying transfer tape to the structure;

FIG. 5I is a cross-sectional view of a semiconductor structure after removing the release tape and applying a polymer (e.g. PDMS) layer; and FIG. 5J is a cross-sectional view of a semiconductor structure illustrating the structure after removal of the transfer tape and adhesive layer.

FIGS. 6A-6F illustrate an exemplary fabrication process of forming an interconnect layer for flexible electronics according to one or more embodiments, in which:

FIG. 6A is a cross-sectional view of a mold for a polymer (e.g. PDMS) microchannel after patterning a mask onto a mechanical support (mold);

FIG. 6B is a cross-sectional view of a mold and a polymer (e.g. PDMS) microchannel after applying a polymer (e.g. PDMS) layer to the structure;

FIG. 6C is a cross-sectional view of a polymer microchannel after removing the mask and mechanical support;

FIG. 6D is a cross-sectional view of a polymer microchannel after forming vias in the polymer (e.g. PDMS) layer;

FIG. 6E is a cross-sectional view of a strain gauge device after applying the polymer (e.g. PDMS) layer to a flexible electronic structure; and FIG. 6F is a cross-sectional view of a final strain gauge device after filling the vias with liquid metal.

DETAILED DESCRIPTION

Various applications could benefit from improved large scale manufacturing methods for mechanically robust, electrically sensitive and flexible devices, including health care, solar cell applications, and flexible optoelectronics including LED and laser applications. In health care applications, for example, bio-inspired structures that incorporate a sensing element and polymer can be desirable in evaluating a number of medical conditions.

Electronics for use in biological applications can measure a change in resistance, mechanical strain, heart pulse, and the like. However, the use of electronics in some biological applications requires contact with biological surfaces, such as the human skin, which can present uneven and non-planar surfaces. To ensure sufficient contact between the electronics and the biological surface, flexibility of the materials can be needed. Using existing semiconductor materials can be possible in such applications if the materials are sufficiently thin to withstand larger mechanical deformation.

The ability to complex, reliability, and performance of thinned down semiconductor materials can be on the same level as solid-state electronics on conventional bulk substrates. However, presently semiconductor bulk substrate materials cannot be conventionally fabricated to the desired thicknesses, which can be on the order of 10 microns. Non-standard processes can provide thinned down semiconductor materials from a thicker bulk substrate, but such methods can be difficult to perform in mass production.

Figures 1A, 1B, 1C:
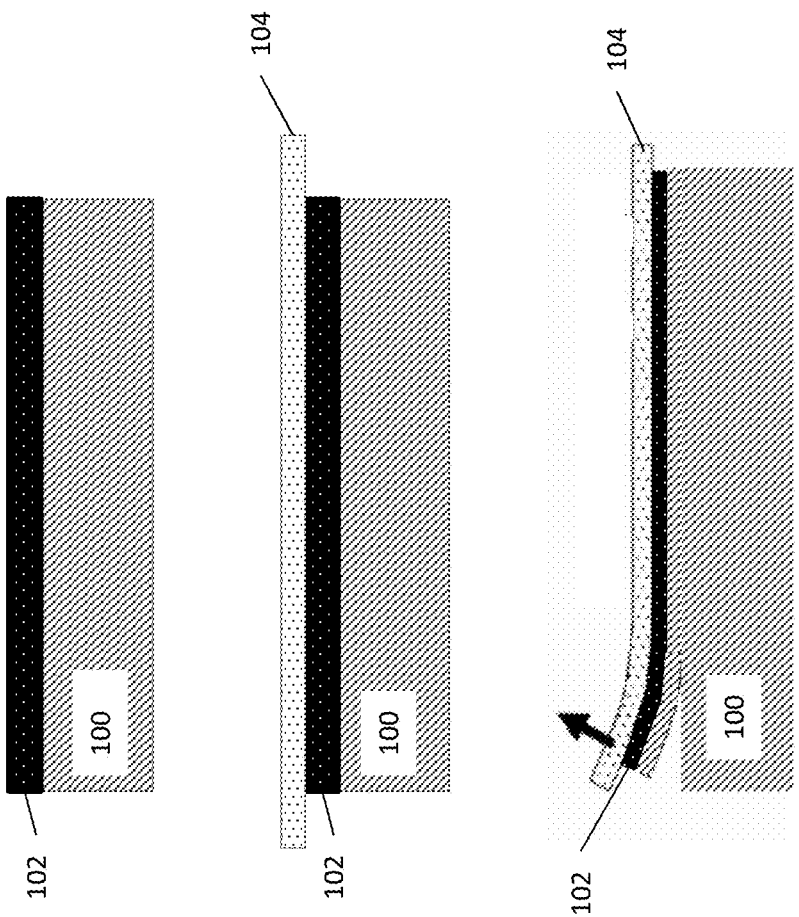

For example, FIGS. 1A-1C illustrate one known process for forming a thinned down semiconductor using a spalling technique. As shown in FIG. 1A, a layer with tensile stress 102 can be deposited on a substrate 100, such as a silicon substrate. Layer with tensile stress, or tensile layer, 102 can be a layer of metal under tensile strain, for instance tensile strained Ni. Next, as shown in FIG. 1B, a flexible handle layer 104 can be disposed on the tensile layer. Handle layer 104 can include, for example a plastic or metal foil that is operatively associated with, i.e., glued, adhered, or bonded to the tensile layer. Then, as shown in FIG. 1C, a known spalling technique can include lifting the tensile layer 102 by means of the attached flexible handle layer 104 to create a thin layer of silicon ribbon from the silicon substrate 100. Although this method can result in a thin silicon ribbon, it is difficult to achieve on a large scale.

Embodiments described herein provide methods for manufacturing highly sensitive flexible sensors and electronics using scalable methods. In some embodiments, methods can include using metal strain gauge on flexible silicon combined with a liquid metal interconnect. In some embodiments, methods include using doped silicon strain gauge on flexible silicon, combined with a liquid metal interconnect.

Figure 2A:
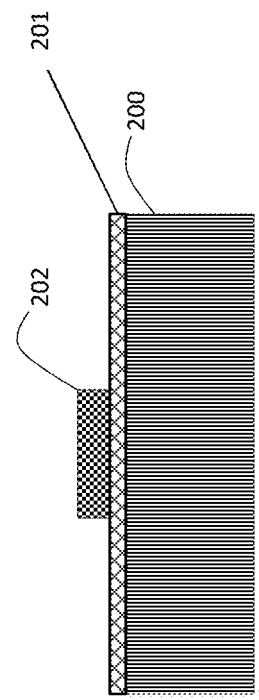

FIGS. 2A-2H illustrate an exemplary fabrication process of forming flexible electronics using metal strain gauge according to one or more embodiments. FIG. 2A is a cross-sectional view illustrating metal conductive material patterning on a semiconductor substrate according to one or more embodiments. A metal 202 is deposited on an insulating layer 201 on top of a bulk silicon substrate 200. The metal 202 can include any metal that changes resistance. In preferred embodiments, metal 202 includes platinum or aluminum. The type of metal 202 can be chosen based upon the intended application. In some embodiments, the metal 202 includes copper, gold, platinum, palladium, nickel, chromium, manganese, or alloys, for instance platinum palladium alloy, copper manganese nickel alloy (e.g., manganine) or nickel chromium alloy (e.g., nichrome). In some embodiments, the insulating layer 201 is an oxide layer, including for instance silicon dioxide or glass.

Figure 2B:
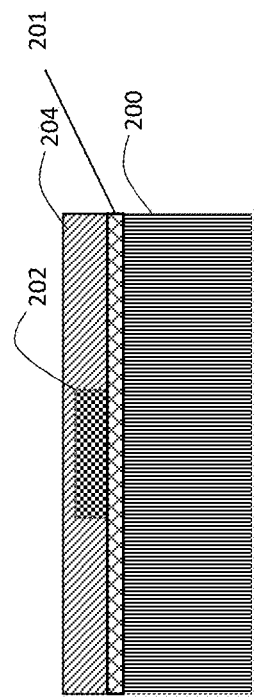

As is illustrated in FIG. 2B, in one or more embodiments, an adhesive layer 204 can be deposited on the metal and silicon substrate. In preferred embodiments, the adhesive layer 204 is a spin-coat adhesive. For example, the adhesive layer 204 can include high temperature adhesives, including polyimide adhesives such as HD3007 provided by Micro-Systems, or low temperature adhesives, such as CR-200 supplied by Brewer Science. In preferred embodiments, the adhesive layer includes HD3007.

Spin-coat processes can be used to apply the adhesive layer 204 to the metal 202 and silicon substrate 200. For example, in an exemplary embodiment, depositing a spin coat adhesive, such as HD3007 on the structure includes dispensing the adhesive on the structure, spinning the structure at a speed of 0 to 800 rpm at a rate of 200 rpm per second, holding for one second, and then spinning the structure from 0 to 1250 rpm at a rate of 300 rpm per second and holding for 45 seconds. In other exemplary embodiments, a structure including a spin coat adhesive can be spun at a rate of 300 rpm per second, 500 rpm per second, or 400 rpm per second. The adhesive layer 204 can have a thickness of 2 to 80 μm, such as from 2 to 20 μm or from 20 to 80 μm. In some embodiments, the adhesive layer 204 has a thickness of 5 to 10 μm. In some embodiments, the adhesive layer 204 can subsequently be baked and cured in accordance with known methods.

As is illustrated in FIG. 2C, an exemplary method includes glass bonding. In some embodiments, a release layer 206 and glass layer 208 can be applied to the structure. Release layer 206 can include any material that can adhere to glass layer 208 and adhesive layer 204, that has adequate thermal stability for the desired process, and that demonstrates UV wavelength sensitivity at a wavelength useful for a laser debonding process. Release layer 206 can include, for example, carbon underlayers, spin-on carbon (SOC) materials, or organic planarizing layers (OPL). In an exemplary embodiment, release layer 206 can include ODL-401 provided by Shin-Etsu. The thickness of the release layer 206 can vary depending upon the material chosen and the strength of UV absorption of the material. For example, release layer 206 can have a thickness of 0.1 to 1 μm.

As illustrated in FIG. 2D, the structure can be inverted such that the silicon layer 200 is exposed and then thinned. The thickness of the silicon layer 200 can be reduced by any known method, such as grinding or chemical mechanical planarization (CMP). The thickness of the silicon layer after thinning can be 1 μm to 50 μm, such as 1 μm to 20 μm, or 1 μm to 10 μm.

Figure 2E:
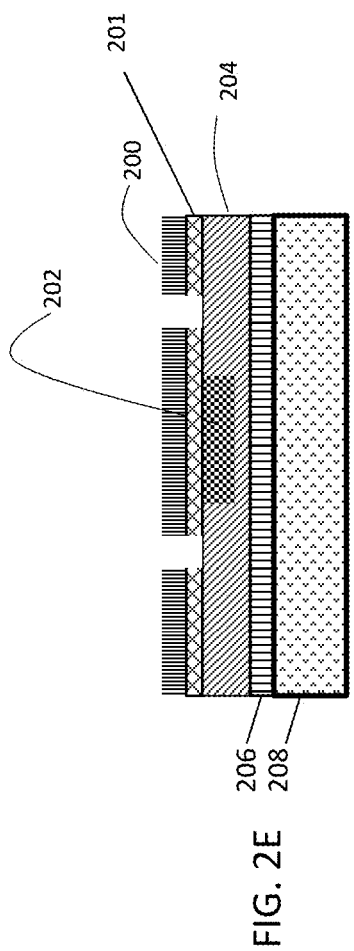

After thinning the silicon layer 200, in an exemplary method the silicon can be etched as illustrated in FIG. 2E. In preferred embodiments, the etch process is a dry etch process, such as deep reactive ion etch (DRIE) to form a pattern. Then, as is illustrated in FIG. 2F1, in some embodiments a polymer (e.g. polydimethylsiloxane (PDMS)) layer 210 is bonded to the silicon 200. Optionally, as is illustrated in FIG. 2F2, the structure can be diced at the wafer level or at the die level before (or after) a polymer layer 210 bonding, as is shown, to remove the ends of the silicon 200, release layer 206, and adhesive layer 204, and glass layer 208.

Figure 2H:
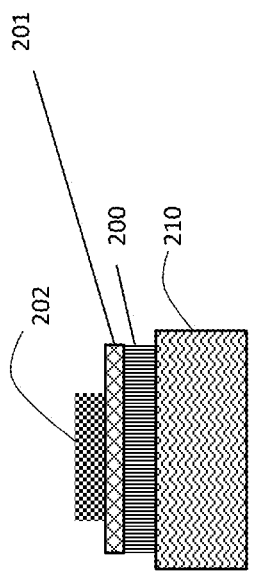

As is illustrated in FIG. 2G1, 2G2, and in FIG. 2H, in some embodiments, the glass layer 208 and release layer 206 can be removed. FIG. 2G1 illustrates the structure of FIG. 2F1 after removing the glass layer 208 and release layer 206. FIG. 2G2 illustrates the structure of FIG. 2F2 after removing the glass layer 208 and release layer 206. In preferred embodiments, the glass is released in a laser debonding process. For example, a laser with a 350 nm wavelength can be applied to the structure such that the release layer 206 loses contact with the silicon 200. In some embodiments, the adhesive layer 204 is then removed by a wet stripping process, as is illustrated in FIG. 2H.

In some embodiments, the resistance of the metal strain gauge is several Ω to several thousand Ω For example, the resistance can be 50Ω to 5000Ω.

In some embodiments, after etching the silicon as illustrated in FIG. 2E, the method can include applying UV release tape to the silicon, using a laser to release the glass and laser release layer from the adhesive layer, applying transfer tape to the silicon, removing the UV release tape, applying a polymer layer to the silicon, and removing the transfer tape to the structure, as is illustrated in FIGS. 3F-3J.

Figure 3C:
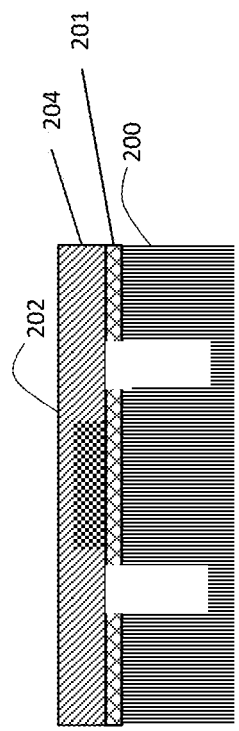

FIGS. 3A-3J illustrate another exemplary fabrication process of forming flexible electronics using metal strain gauge according to one or more embodiments. FIG. 3A is a cross-sectional view illustrating metal patterning on a semiconductor substrate according to one or more embodiments. A metal 202 is deposited on an insulating layer 201 on top of a bulk silicon substrate 200. The silicon substrate 200 can have a thickness of 700 to 800 μm, or greater. As is illustrated in FIG. 3B, the bulk silicon substrate can be etched by DRIE.

As is illustrated in FIG. 3C, the exemplary method can include applying an adhesive layer 204 to the metal 202 and silicon substrate 200.

Figure 3D:
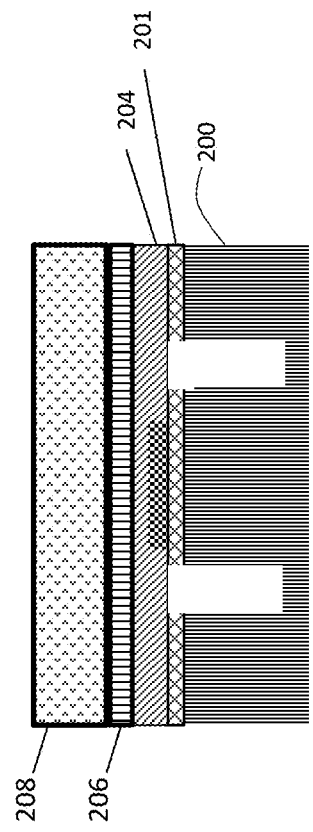

As is illustrated in FIG. 3D, the exemplary method can include bonding a release layer 206 and a glass layer 208 to the adhesive layer 204 after the release layer 206 is applied onto the glass layer 208.

Figure 3E:
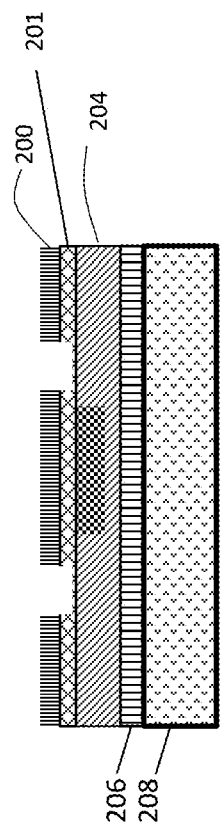

As is illustrated in FIG. 3E, the exemplary method can include inverting the structure such that the silicon layer 200 is exposed and then reducing the thickness of the silicon 200.

Figure 3F:
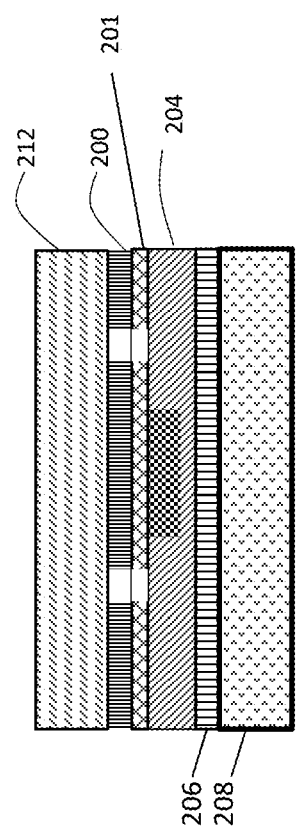
Figure 3G:
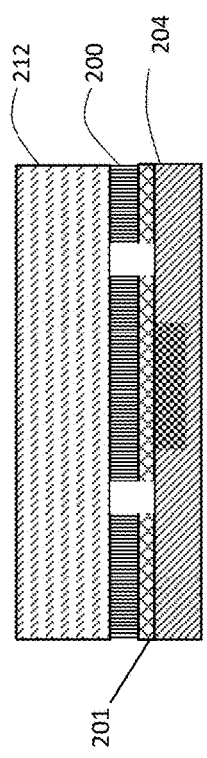

As is illustrated in FIG. 3F, the exemplary method can include applying UV release tape 212 to the silicon 200. Then, as is illustrated in FIG. 3G, the exemplary method can include using a laser to release the glass and laser release layer from the adhesive layer 204. Then, in some embodiments, the adhesive layer 204 is removed by a wet stripping process.

Figure 3H:
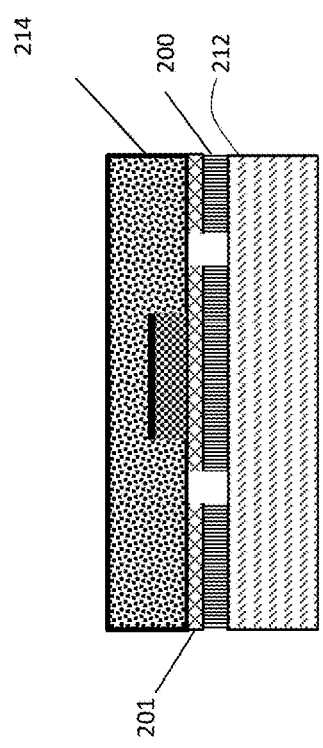

As is illustrated in FIG. 3H, transfer tape 214 can be applied to the silicon layer 200.

Figure 3I:
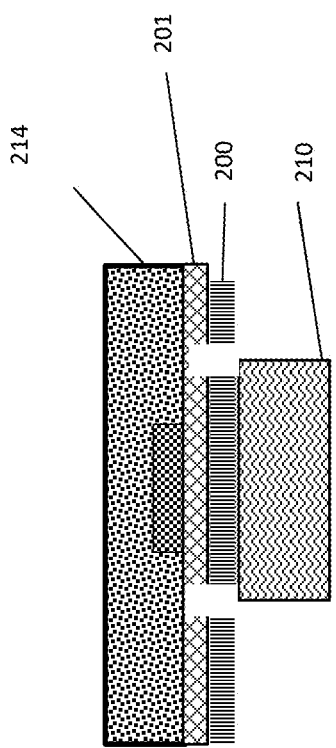

As is illustrated in FIG. 3I, the method can include removing the UV release tape 212. After removing the UV release tape 212, the method can include applying a polymer (e.g. PDMS) layer 210 to the silicon 200.

Figure 3J:
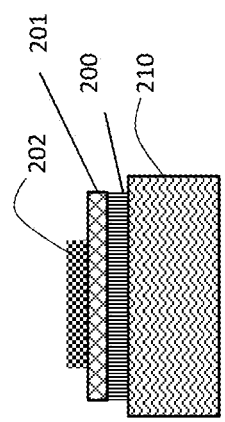

As is illustrated in FIG. 3J, the transfer tape can be removed from the structure.

In some embodiments, the resistance of the doped silicon strain gauge is several Ω to several thousand Ω. For example, the resistance can be 50Ω to 5000Ω.

In some embodiments, after inverting the structure such that the silicon layer 200 is exposed and then reducing the thickness of the silicon 200 as is illustrated in FIG. 3E, the method can include applying a polymer layer to the silicon, removing the glass layer and release layer, and removing the adhesive layer, as is illustrated in FIGS. 2F-2G.

Figure 4A:
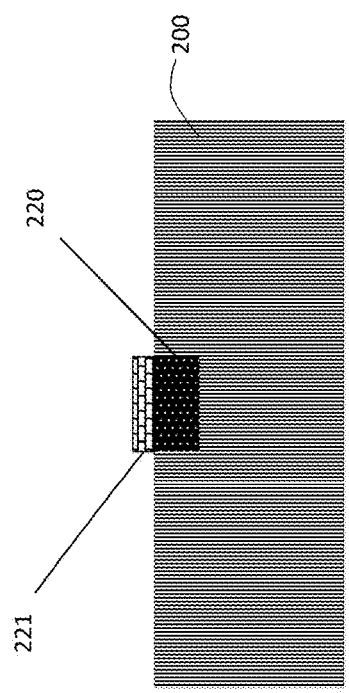

FIGS. 4A-4H illustrate an exemplary fabrication process of forming flexible electronics using doped silicon strain gauge according to one or more embodiments. FIG. 4A is a cross-sectional view illustrating depositing a metal ohmic contact material 221 after doping a silicon substrate 200 to provide a doped region 220. Doping can be selective doping, such that a specific area or region of the substrate is doped, or doping can be non-selective, for example such that the entire silicon substrate is doped. Non-limiting examples of suitable dopant materials include p-type dopants (e.g., boron), n-type dopants (e.g., phosphorus), or any combination thereof. In some embodiments, the metal ohmic contact material 221 includes gold, nickel, titanium, aluminum, silicide, or combinations thereof.

Figure 4B:
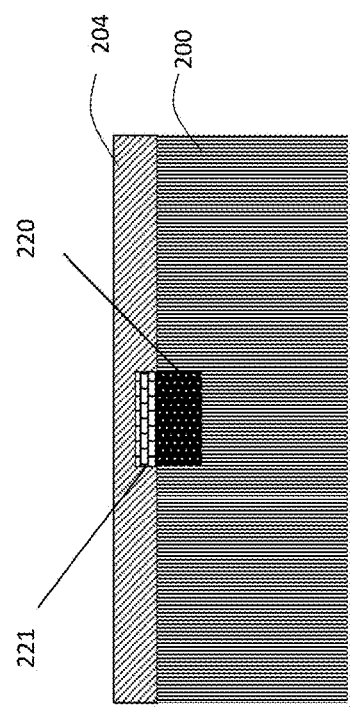

As is illustrated in FIG. 4B, in one or more embodiments, an adhesive layer 204 can be deposited on the doped silicon substrate 220, 200.

Figure 4C:
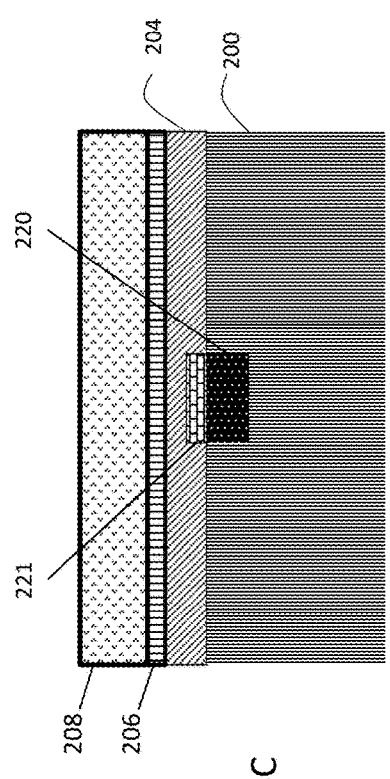

As is illustrated in FIG. 4C, an exemplary method includes glass bonding. In some embodiments, a glass layer 208 is bonded to silicon substrate 200 after the release layer 206 is applied onto the glass layer 208.

Figure 4D:
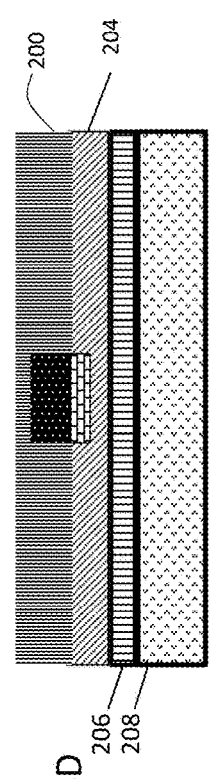

As illustrated in FIG. 4D, the structure can be inverted such that the silicon layer 200 is exposed and then thinned. The thickness of the silicon layer 200 can be reduced by any known method, such as grinding or chemical mechanical planarization (CMP).

Figure 4E:
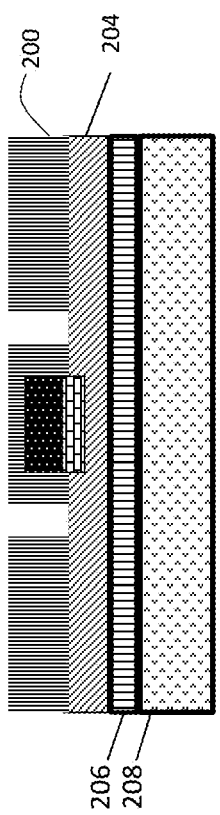

After thinning the silicon layer 200, in an exemplary method the silicon can be etched as illustrated in FIG. 4E. In preferred embodiments, the etch process is a dry etch process, such as deep reactive ion etch (DRIE) to form a pattern. Then, as is illustrated in FIG. 4F1, in some embodiments a polymer (e.g. polydimethylsiloxane (PDMS)) layer 210 is bonded to the silicon 200. Optionally, as is illustrated in FIG. 4F2, the structure can be diced at the wafer level or at the die level before (or after) a polymer layer 210 bonding, as is shown, to remove the ends of the silicon 200, release layer 206, and adhesive layer 204, and glass layer 208. In some embodiments, for example when the entire silicon substrate is doped, the polymer (e.g. PDMS) layer 210 can be applied to the doped silicon region (not shown).

Figure 4H:
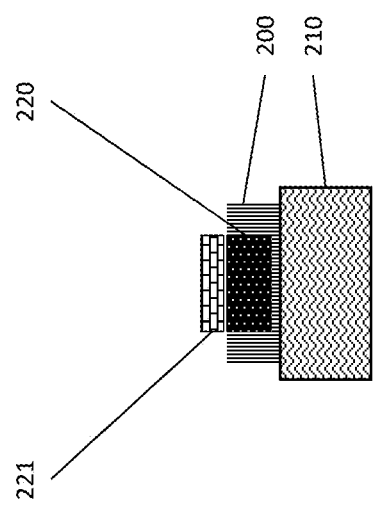

As is illustrated in FIG. 4G1, 4G2, and in FIG. 4H, in some embodiments, the glass layer 208 and release layer 206 can be removed. FIG. 4G1 illustrates the structure of FIG. 4F1 after removing the glass layer 208 and release layer 206. FIG. 4G2 illustrates the structure of FIG. 4F2 after removing the glass layer 208 and release layer 206. In preferred embodiments, the glass is released in a laser debonding process. In some embodiments, the adhesive layer 204 is then removed from the silicon layer 200 by a wet stripping process, as is illustrated in FIG. 4H.

In some embodiments, after thinning the silicon layer 200 as illustrated in FIG. 4E, the method can include applying UV release tape to the silicon, removing the glass and laser release layer from the adhesive layer, removing the adhesive layer, applying transfer tape to the silicon layer, removing the UV release tape, applying a polymer layer to the silicon, and removing the transfer tape, as is illustrated in FIGS. 5F-5J.

Figure 5A:
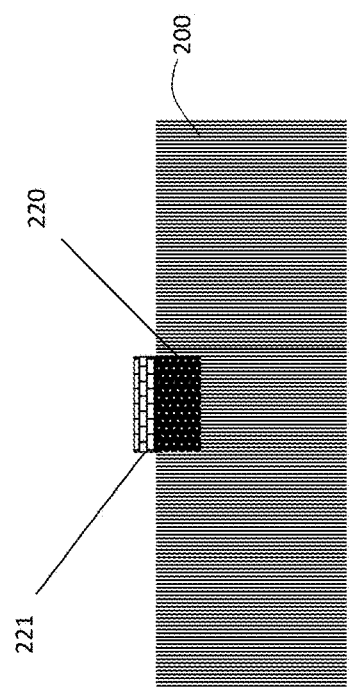
Figure 5B:
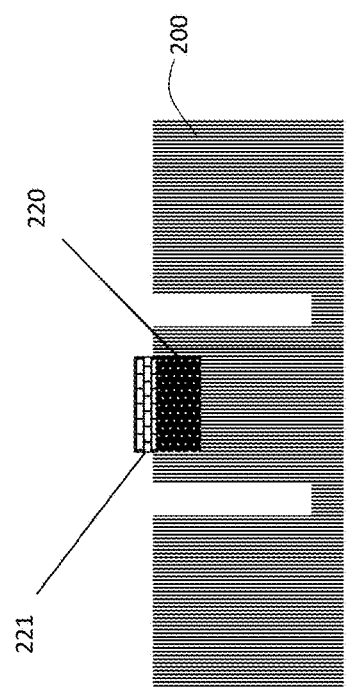

FIGS. 5A-5J illustrate another exemplary fabrication process of forming flexible electronics using doped silicon strain gauge according to one or more embodiments. FIG. 5A is a cross-sectional view illustrating doping a silicon substrate 200 to provide a doped region 220. Doping can be selective doping, such that a specific area or region of the substrate is doped, or doping can be non-selective, for example such that the entire silicon substrate is doped. Non-limiting examples of suitable dopant materials include p-type dopants (e.g., boron), n-type dopants (e.g., phosphorus), or any combination thereof. As is illustrated in FIG. 5B, the bulk silicon substrate can be etched by DRIE.

Figure 5C:
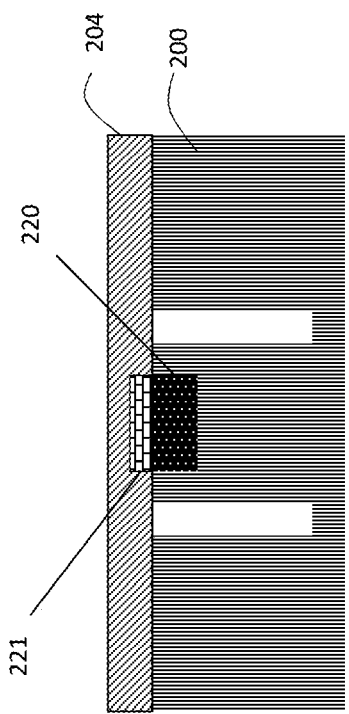

As is illustrated in FIG. 5C, the exemplary method can include applying an adhesive layer 204 to the doped silicon region 200 and silicon substrate 200.

Figure 5D:
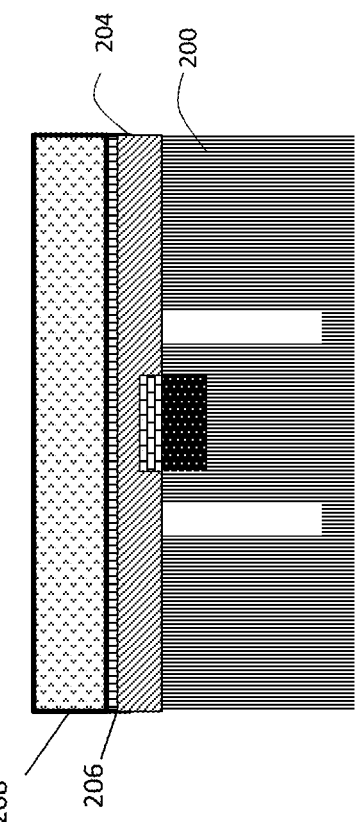

As is illustrated in FIG. 5D, the exemplary method can include bonding a release layer 206 and a glass layer 208 to the adhesive layer 204.

As is illustrated in FIG. 5E, the exemplary method can include inverting the structure such that the silicon layer 200 is exposed and then reducing the thickness of the silicon 200.

Figure 5G:
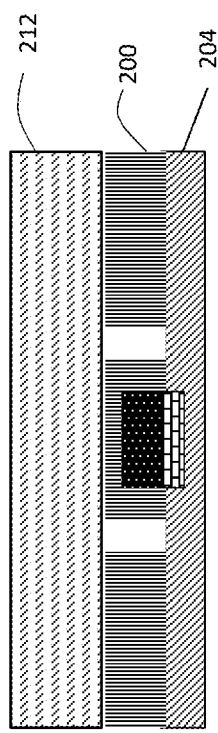

As is illustrated in FIG. 5F, the exemplary method can include applying UV release tape 212 to the silicon 200. Then, as is illustrated in FIG. 5G, the exemplary method can include using a laser to release the glass and laser release layer from the adhesive layer 204. In some embodiments, then the adhesive layer 204 is then removed from the silicon 200 by a wet stripping process.

Figure 5H:
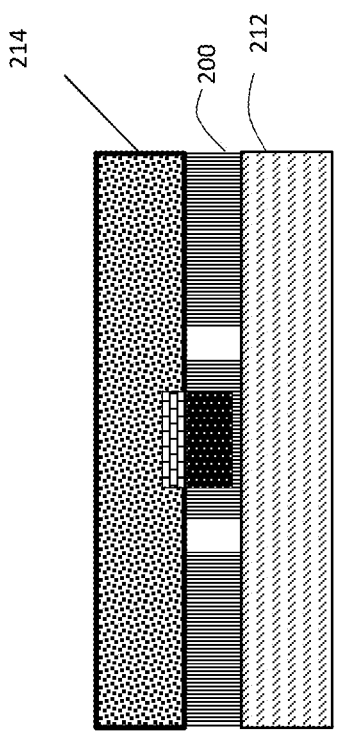

As is illustrated in FIG. 5H, transfer tape 214 can be applied to the silicon layer 200.

Figure 5I:
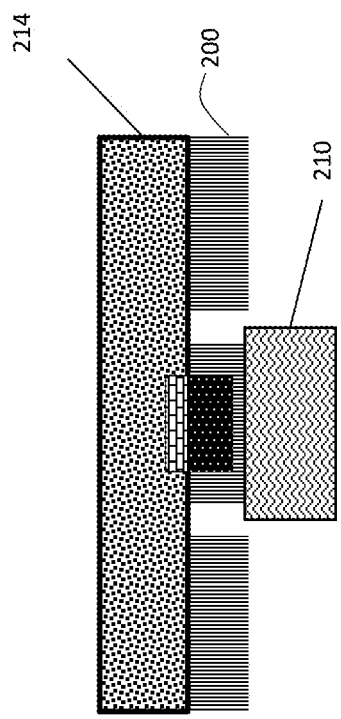

As is illustrated in FIG. 5I, the method can include removing the UV release tape 212. After removing the UV release tape 212, the method can include applying a polymer (e.g. PDMS) layer 210 to the silicon 200.

Figure 5J:
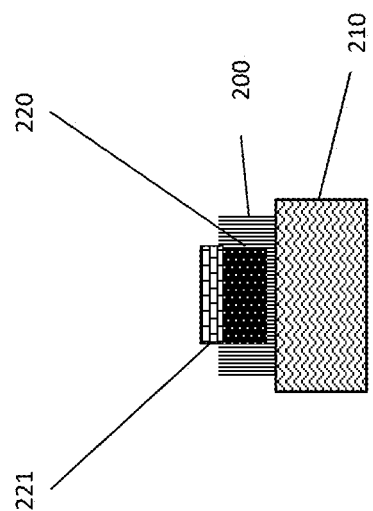

As is illustrated in FIG. 5J, the transfer tape can be removed from the structure.

In some embodiments, after inverting the structure such that the silicon layer 200 is exposed and then reducing the thickness of the silicon 200 as is illustrated in FIG. 5E, the method can include applying a polymer layer to the silicon, removing the glass layer and release layer, and removing the adhesive layer, as illustrated in FIGS. 4F-4H.

FIGS. 6A-6F illustrate an exemplary fabrication process of forming a polymer microchannel layer for flexible electronics according to one or more embodiments.

Figure 6A:
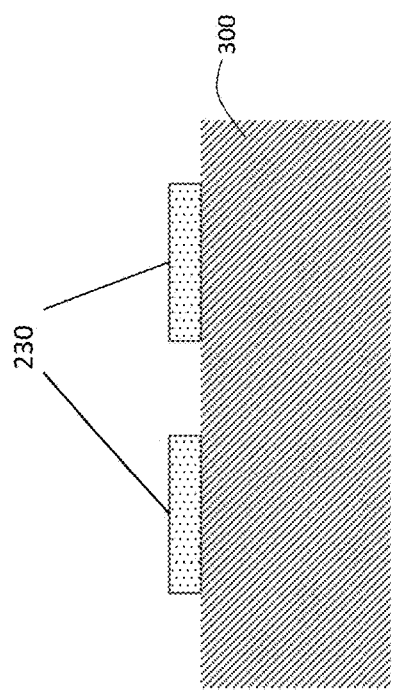

As is illustrated in FIG. 6A, the exemplary method can include patterning a mask 230 onto a mechanical support 300 or a mold. In some embodiments, the mechanical support can contain include, for example, photoresist on silicon or glass. The mask 230 can be patterned with known photolithographic techniques.

Figure 6B:
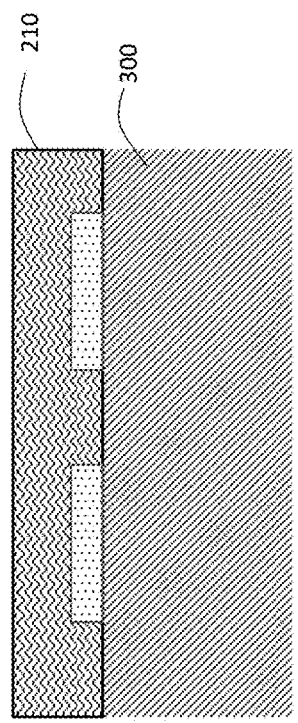
Figure 6C:
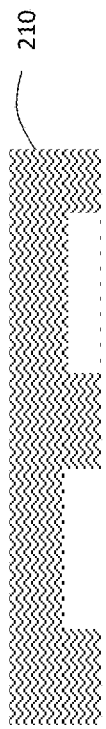

As is illustrated in FIG. 6B, a polymer microchannel layer 210, for example a polymer (e.g. PDMS) layer can be applied to the structure to form a pattern in the polymer microchannel layer 210 based upon the mask 230. In some embodiments, a silicon support and mask can be coated with a hydrophobic layer, such as a silane layer, prior to adding a polymer (e.g. PDMS) layer. Then, as is illustrated in FIG. 6C, the patterned polymer microchannel layer 210 can be removed from the mask and mechanical support. In some embodiments, the interconnect layer has a thickness greater than or equal to 50 μm.

Figure 6D:
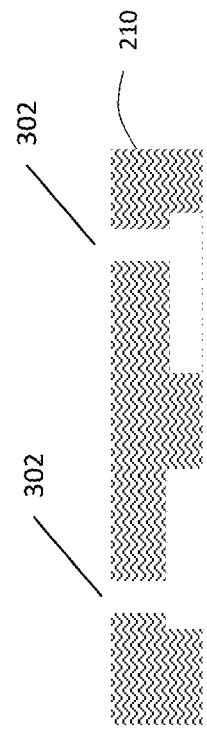

As is illustrated in FIG. 6D, two or more vias 302 can be formed in the polymer microchannel layer 210. In some embodiments, the vias 302 can be formed by mechanical punch or by drilling.

Then, in some embodiments, the resultant polymer microchannel layer 210 can be applied to a flexible electronic structure. The flexible electronic structure can be any flexible electronic structure described herein. For instance, FIG. 6E illustrates a cross-sectional view of a strain gauge device after applying a polymer microchannel layer 210 including two vias 302 to a flexible electronic structure including a doped silicon region 220, a metal ohmic contact material 221, and a thinned silicon layer 200 on a polymer (e.g. PDMS) layer 210.

As is illustrated in FIG. 6F, a liquid metal 304 can be applied to the vias 304 in a strain gauge device. In preferred embodiments, the liquid metal 304 can be in contact with metal not shown or a metal ohmic contact material 221 adjacent a doped silicon region 220 and can thereby form a connection to the outer surface of the polymer (e.g. PDMS) layer. The liquid metal 304 can include any conductive metal material that is liquid at room temperature. For example, liquid metal can include eutectic liquid metal alloys, such as those containing gallium (Ga), indium (In), tin (Sn), or combinations thereof. In some embodiments, the liquid metal is Galistan (68.5% Ga, 21.5% In, and 10% Sn, by weight).

The shapes and dimensions of the flexible electronic structures (e.g. strain gauge) can vary depending upon the desired application. For example, but not by way of limitation, the flexible electronic structures can be manufactured in a bar shape, a u shape, or an m shape. The flexible electronic structures can be connected in any pattern, depending upon the desired application.

Flexible electronic structures manufactured according to methods described herein can be used in a variety of biological and medical applications. For instance, one of the Unified Parkinson's Disease Rating Scale (UPDRS) items measures finger tapping in daily neurological applications to assess bradykinesia and disturbances of rhythm formation. Assessment of finger tapping can include measurement of velocity, amplitude, and rhythm of tapping. While conventional evaluation of these factors is subjective, flexible electronic structures can provide objective data for such analyses. For instance, flexible electronic structures described herein can measure a distance between a finger and a thumb or can include an accelerometer to provide data concerning movement in three dimensions. For example, a strain gauge sensor can provide a simple linear relation between a change in resistance of the sensor and the strain applied to the sensor.

Deposition is any process that grows, coats, or otherwise transfers a material onto a substrate. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

The etching process can include a dry etch (e.g., reactive ion etching, plasma etching, ion beam etching, or laser ablation). The etching process can alternatively include a wet chemical etch (e.g., with potassium hydroxide, or sulfuric acid and hydrogen peroxide). In some exemplary embodiments, both dry etching and wet chemical etching processes can be used. After transferring the pattern, the patterned photoresist is removed utilizing resist stripping processes, for example, ashing. Ashing can be used to remove a photoresist material, amorphous carbon, or organic planarization (OPL) layer. Ashing is performed using a suitable reaction gas, for example, $O_2$, $N_2$, $H_2/N_2$, $O_3$, $CF_4$, or any combination thereof.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of manufacturing a flexible electronic structure, the electronic structure having a top side and a bottom side, the method comprising:
   patterning a metal conductive material on a silicon substrate on the top side of the structure;
   depositing an adhesive layer on the top side of the structure;
   depositing a release layer and a glass layer on the top side of the structure;
   reducing a thickness of the silicon substrate on the bottom side of the structure to a thickness of 1 μm to 50 μm;
   applying a polymer microchannel layer comprising a plurality of vias to the top side of the structure; and
   filling the vias with a conductive metal material that is liquid at room temperature such that the conductive metal material that is liquid at room temperature contacts the metal conductive material.

2. The method of manufacturing according to claim 1, wherein reducing the thickness of the silicon substrate comprises grinding the substrate.

3. The method of manufacturing according to claim 1, wherein reducing the thickness of the silicon substrate comprises performing CMP.

4. The method of manufacturing according to claim 1, further comprising etching the silicon substrate.

5. The method of manufacturing according to claim 1, further comprising depositing a polymer layer on the bottom side of the structure.

6. The method of manufacturing according to claim 1, further comprising removing the glass layer and the adhesive layer from the structure.

7. The method of manufacturing according to claim 1, wherein the conductive metal material is a metal alloy consisting essentially of gallium, indium, and tin.

8. A method for manufacturing a flexible electronic structure having a top side and a bottom side, the method comprising:
   patterning a metal on a silicon substrate on the top side of the structure;
   etching the silicon substrate on the top side of the structure with deep reactive ion etch;
   depositing an adhesive layer on the top side of the structure;
   depositing a release layer and a glass layer on the top side of the structure;
   reducing a thickness of the silicon substrate on the bottom side of the structure to a thickness of 1 µm to 50 µm;
   applying a polymer microchannel layer comprising a plurality of vias to the top side of the structure; and
   filling the vias with a conductive metal material that is liquid at room temperature such that the conductive metal material that is liquid at room temperature contacts the metal.

9. The method of manufacturing according to claim 8, further comprising applying UV release tape to the etched silicon substrate on the bottom side of the structure.

10. The method of manufacturing according to claim 8, further comprising removing the release layer, the glass layer, and the adhesive layer from the structure.

11. The method of manufacturing according to claim 10, further comprising, after removing the release layer, the glass layer, and the adhesive layer, applying transfer tape to the silicon layer on the top side of the structure.

12. The method of manufacturing according to claim 11, further comprising applying a polymer layer to the bottom side of the structure and removing the transfer tape and the adhesive layer from the structure.

13. A method of manufacturing a flexible electronic structure, the electronic structure having a top side and a bottom side, the method comprising:
   doping a silicon substrate on the top side of the structure with a dopant to form a doped region;
   depositing a metal ohmic contact material on the doped region;
   depositing an adhesive layer on the top side of the structure;
   depositing a release layer and a glass layer on the top side of the structure;
   reducing a thickness of the silicon substrate on the bottom side of the structure to a thickness of 1 µm to 50 µm;
   applying a polymer microchannel layer comprising a plurality of vias to the top side of the structure; and
   filling the vias with a conductive metal material that is liquid at room temperature such that the conductive metal material that is liquid at room temperature contacts the metal ohmic contact material.

14. The method of manufacturing according to claim 13, wherein the doping is selective doping to create a doped region.

15. The method of manufacturing according to claim 13, wherein the dopant is boron, phosphorus, or a combination thereof.

16. The method of manufacturing according to claim 13, wherein reducing the thickness of the silicon substrate comprises performing CMP.

17. The method of manufacturing according to claim 13, further comprising etching the silicon substrate.

18. The method of manufacturing according to claim 13, further comprising depositing a polymer layer on the bottom side of the structure and removing the glass layer and the adhesive layer from the structure.

19. The method of manufacturing according to claim 1, wherein the conductive metal material that is liquid at room temperature comprises a eutectic liquid metal alloy.

20. The method of manufacturing according to claim 7, wherein the gallium is present in an amount of 68.5% by weight, the indium is present in an amount of 21.5% by weight, and the tin is present in an amount of 10% by weight, relative to the total weight of the conductive metal material.

* * * * *